United States Patent
Mutyala et al.

(10) Patent No.: US 12,412,741 B2
(45) Date of Patent: Sep. 9, 2025

(54) SILICON OXIDE GAP FILL USING CAPACITIVELY COUPLED PLASMAS

(71) Applicant: Applied Materials, Inc., Santa Clara, CA (US)

(72) Inventors: Madhu Santosh Kumar Mutyala, Santa Clara, CA (US); Deenesh Padhi, Sunnyvale, CA (US); Hang Yu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 566 days.

(21) Appl. No.: 16/951,495

(22) Filed: Nov. 18, 2020

(65) Prior Publication Data

US 2022/0157602 A1    May 19, 2022

(51) Int. Cl.
*H01L 21/02* (2006.01)
*C23C 16/455* (2006.01)
(Continued)

(52) U.S. Cl.
CPC .. *H01L 21/02274* (2013.01); *C23C 16/45536* (2013.01); *H01L 21/3065* (2013.01); *H01L 21/67017* (2013.01)

(58) Field of Classification Search
CPC .. H01L 21/762–76264; H01L 21/02271–0228
See application file for complete search history.

(56) References Cited

U.S. PATENT DOCUMENTS 5,851,600 A * 12/1998 Horiike ............... C23C 16/509
                                                            427/535
5,858,184 A *  1/1999 Fu ...................... C23C 14/0641
                                                            438/653
(Continued)

FOREIGN PATENT DOCUMENTS

JP    2008182199 A    8/2008
JP    2014532304 A    12/2014
(Continued)

OTHER PUBLICATIONS

International Search Report and Written Opinion mailed Mar. 8, 2022 in International Patent Application No. PCT/US2021/059181, 9 pages.
(Continued)

*Primary Examiner* — Jarrett J Stark
(74) *Attorney, Agent, or Firm* — Kilpatrick Townsend & Stockton LLP

(57) ABSTRACT

Exemplary deposition methods may include introducing a precursor into a processing region of a semiconductor processing chamber via a faceplate of the semiconductor processing chamber. The methods may include flowing an oxygen-containing precursor into the processing region from beneath a pedestal of the semiconductor processing chamber. The pedestal may support a substrate. The substrate may define a trench in a surface of the substrate. The methods may include forming a first plasma of the precursor in the processing region of the semiconductor processing chamber. The methods may include depositing a first oxide film within the trench. The methods may include forming a second plasma in the processing region. The methods may include etching the first oxide film, while flowing the oxygen-containing precursor. The methods may include re-forming the first plasma in the processing region. The methods may also include depositing a second oxide film over the etched oxide film.

8 Claims, 4 Drawing Sheets

(51) Int. Cl.
*H01L 21/3065* (2006.01)
*H01L 21/67* (2006.01)

(56) References Cited

U.S. PATENT DOCUMENTS

| | | | |
|---|---|---|---|
| 6,211,040 B1 | 4/2001 | Liu et al. | |
| 6,364,995 B1 * | 4/2002 | Fairbairn | H01J 37/32091 156/345.1 |
| 7,524,750 B2 | 4/2009 | Nemani et al. | |
| 8,133,797 B2 * | 3/2012 | van Schravendijk | H01L 21/76801 438/296 |
| 8,716,154 B2 * | 5/2014 | Bhatia | H01L 21/0234 438/790 |
| 9,404,178 B2 * | 8/2016 | Liang | C23C 16/56 |
| 9,768,034 B1 * | 9/2017 | Xu | H01J 37/3244 |
| 10,014,185 B1 * | 7/2018 | Wu | H01L 21/32135 |
| 10,014,207 B2 * | 7/2018 | Tsai | H01L 21/02274 |
| 10,049,891 B1 * | 8/2018 | Wang | H01J 37/32357 |
| 10,468,267 B2 * | 11/2019 | Chen | H01L 21/32135 |
| 10,529,622 B1 * | 1/2020 | Maniscalco | H01L 21/76858 |
| 2001/0037761 A1 * | 11/2001 | Ries | C30B 25/12 423/328.1 |
| 2003/0136332 A1 | 7/2003 | Krishnaraj et al. | |
| 2003/0207580 A1 | 11/2003 | Li et al. | |
| 2004/0245091 A1 * | 12/2004 | Karim | C23C 16/56 257/E21.252 |
| 2009/0191687 A1 * | 7/2009 | Hong | H01L 21/76232 257/E21.546 |
| 2010/0041207 A1 | 2/2010 | Lee et al. | |
| 2010/0300888 A1 * | 12/2010 | Ponnuswamy | C25D 17/001 204/229.4 |
| 2011/0233198 A1 * | 9/2011 | Okuno | H05B 6/806 219/651 |
| 2012/0024479 A1 * | 2/2012 | Palagashvili | H01J 37/32642 118/728 |
| 2012/0225566 A1 * | 9/2012 | Hamano | H01J 37/32669 257/E21.24 |
| 2014/0302689 A1 | 10/2014 | Ashtiani et al. | |
| 2015/0111374 A1 * | 4/2015 | Bao | H01L 21/76876 438/669 |
| 2016/0020092 A1 * | 1/2016 | Kang | H01L 21/76898 438/789 |
| 2016/0027618 A1 * | 1/2016 | Kawakami | H01J 37/32816 156/345.29 |
| 2016/0322215 A1 * | 11/2016 | Shaikh | C23C 16/45587 |
| 2017/0148628 A1 * | 5/2017 | Swaminathan | H01L 21/02348 |
| 2018/0005814 A1 * | 1/2018 | Kumar | C23C 16/345 |
| 2018/0138085 A1 * | 5/2018 | Wang | H01L 21/32135 |
| 2019/0287787 A1 * | 9/2019 | Nishino | H01L 21/0228 |
| 2019/0385844 A1 | 12/2019 | Vats et al. | |
| 2021/0025058 A1 * | 1/2021 | Jiang | C23C 16/505 |
| 2022/0195620 A1 * | 6/2022 | Qu | H01L 21/322 |
| 2022/0301893 A1 * | 9/2022 | Wei | H01L 21/67017 |

FOREIGN PATENT DOCUMENTS

| | | |
|---|---|---|
| JP | 2018011050 A | 1/2018 |
| JP | 2018513567 A | 5/2018 |
| KR | 2008-0079453 A | 9/2008 |

OTHER PUBLICATIONS

JP2023-528613, "Office Action", Jul. 15, 2025, 18 pages.

* cited by examiner

SILICON OXIDE GAP FILL USING CAPACITIVELY COUPLED PLASMAS

TECHNICAL FIELD

The present technology relates to semiconductor processes and chamber components. More specifically, the present technology relates to modified components and deposition methods.

BACKGROUND

Integrated circuits are made possible by processes which produce intricately patterned material layers on substrate surfaces. Producing patterned material on a substrate requires controlled methods of formation and removal of exposed material. As device sizes continue to shrink, trenches may approach a characteristic dimension or aspect ratio smaller than that where typical deposition processes may form voids within the trench when the trench is filled in a single deposition operation. During deposition methods, chemical vapor deposition processes may deposit oxide films including void volumes in the trenches, which may affect device quality.

Thus, there is a need for improved systems and methods that can be used to produce high quality devices and structures. These and other needs are addressed by the present technology.

SUMMARY

Exemplary deposition methods may include introducing a precursor into a processing region of a semiconductor processing chamber via a faceplate of the semiconductor processing chamber. The methods may include flowing an oxygen-containing precursor into the processing region from beneath a pedestal of the semiconductor processing chamber. The pedestal may support a substrate. The substrate may define a trench in a surface of the substrate. The methods may include forming a first plasma of the precursor in the processing region of the semiconductor processing chamber. The methods may include depositing a first oxide film within the trench. The methods may include forming a second plasma in the processing region. The methods may include etching the first oxide film, while flowing the oxygen-containing precursor. The methods may include passivating the etched oxide film. The methods may include re-forming the first plasma in the processing region. The methods may also include depositing a second oxide film over the etched oxide film.

In some embodiments, flowing the oxygen-containing precursor into the processing region may include flowing oxygen into the semiconductor processing chamber at a flowrate of at least 5 slm. The first plasma may be or include a capacitively coupled plasma. The first plasma may be struck between the pedestal and the faceplate of the semiconductor processing chamber. The second plasma may be or include a capacitively coupled plasma. The second plasma may be struck between the pedestal and the faceplate. Etching the deposited oxide film may include purging the semiconductor processing chamber, introducing an etchant gas into the processing region, and forming the second plasma of the etchant gas in the processing region. Purging the semiconductor processing chamber may include extinguishing the first plasma and exchanging the precursor and the oxygen-containing precursor for the etchant gas in the processing region. The etchant gas may be or include a fluorine-containing gas. The precursor may be or include silane.

Some embodiments of the present technology may encompass deposition methods. The methods may include introducing a precursor into a processing region of a semiconductor processing chamber. The methods may include forming a plasma in the processing region between a faceplate and a pedestal of the semiconductor processing chamber. The pedestal may support a substrate defining a trench in a surface of the substrate. The methods may include depositing a first oxide film in the trench. The methods may include modifying a spacing between the pedestal and the faceplate from a first spacing to a second spacing. The methods may include etching the first oxide film. The methods may include modifying the spacing between the pedestal and the faceplate from the second spacing to the first spacing. The methods may include re-forming the plasma in the processing region. The methods may also include depositing a second oxide film over the etched oxide film.

In some embodiments, the first spacing may be at least 200 mils. The second spacing may be less than 340 mils. The first spacing may be less than 340 mils. The second spacing may be at least 200 mils. The precursor may be or include tetra-ethyl orthosilicate. The plasma may be a first plasma. Etching the deposited oxide film may include purging the semiconductor processing chamber, flowing oxygen from beneath the pedestal, introducing a etchant gas into the processing region, and forming a second plasma in the processing region. The halogen precursor may be or include nitrogen trifluoride. The second plasma may be a capacitively coupled plasma. The second plasma may be struck between the pedestal and the faceplate.

Some embodiments of the present technology may encompass deposition methods. The methods may include flowing a precursor into a processing region of a semiconductor processing chamber via a faceplate of the semiconductor processing chamber. The precursor may be or include a silicon source gas and an inert gas. The methods may include forming a plasma in the processing region between the faceplate and a pedestal of the semiconductor processing chamber, the pedestal supporting a substrate. The methods may include depositing a first oxide film on the substrate. The methods may include halting delivery of the silicon source gas while flow of the inert gas is maintained. The methods may include flowing an etchant gas into the processing region while the plasma is active. The methods may include etching the first oxide film by the plasma in the processing region. The methods may include stopping the etchant gas while the inert gas is flowing. The methods may include flowing the silicon source gas while the plasma is active. The methods may also include depositing a second oxide film over the etched oxide film.

In some embodiments, the plasma may be a capacitively coupled plasma. The plasma may be struck between the pedestal and the faceplate. The methods may further include flowing an oxygen-containing precursor into the processing region from beneath the pedestal, before etching the first oxide film. Flowing the oxygen-containing precursor into the processing region may include flowing oxygen into the semiconductor processing chamber at a flowrate of at least 5 slm. The pedestal and the faceplate may be separated by a spacing of at least 200 mils while depositing the first oxide film and the second oxide film.

Such technology may provide numerous benefits over conventional systems and techniques. For example, the methods and systems may provide oxide films within high aspect ratio trenches. In this way, the operations of embodiments of the present technology may produce improved CMOS processes, which may facilitate the fabrication of smaller semiconductor features. In addition, the methods and systems may provide improved uniformity of deposition-etch-deposition processes, for example, by reducing etching of chamber surfaces or by providing improved exposure of substrate surfaces to plasma generated species. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
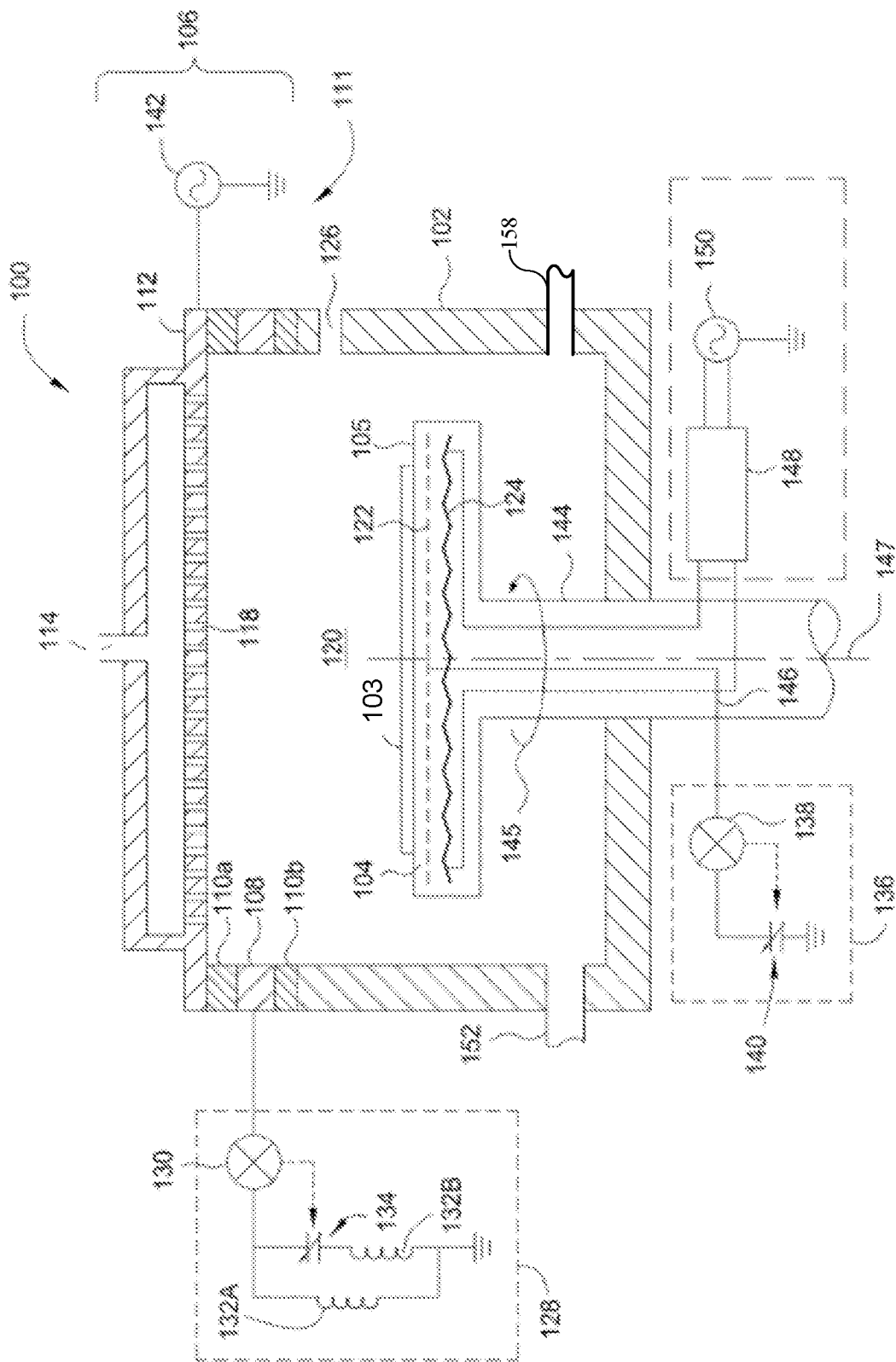
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During material deposition, such as of oxide materials, plasma enhanced deposition may produce a local plasma between a showerhead or gas distributor and a substrate support. As precursors are activated in the plasma, the deposition materials may form and deposit on the substrate. Where the substrate defines recessed features, such as trenches or gaps, the deposition materials thus generated may deposit on the substrate as a conformal coating that bridges over the recessed features. In such cases, the conformal coating may leave the recessed features unfilled, limiting the effectiveness of coating processes to fabricate gap-fill structures.

Conventional technology has approached this limitation through process integration techniques, such as control of plasma parameters or flow control techniques. The present technology may overcome these limitations by implementing improved deposition methods to form oxide materials within recessed features of a substrate. For example, a capacitively coupled plasma may be struck between a substrate support and a showerhead of a semiconductor processing chamber, while flowing oxygen into the chamber from beneath the substrate support. This may enable deposition-etch-deposition processes to formed oxide films within trenches defined in the substrate without forming voids in the trenches. This may enable fabrication operations as part of a CMOS process on substrates defining recessed features of a characteristic dimension below that where conventional technology will form voids within the recessed features, rather than filling the recessed features. After describing general aspects of a chamber according to embodiments of the present technology in which plasma processing may be performed, specific methodology and component configurations may be discussed. It is to be understood that the present technology is not intended to be limited to the specific films and processing discussed, as the techniques described may be used to improve a number of film formation processes, and may be applicable to a variety of processing chambers and operations.

FIG. 1 shows a cross-sectional view of an exemplary processing chamber 100 according to some embodiments of the present technology. The figure may illustrate an overview of a system incorporating one or more aspects of the present technology, and/or which may perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing region 120. A substrate 103 may be provided to the processing region 120 through an opening 126, which may be conventionally sealed for processing using a slit valve or door. The substrate 103 may be seated on a surface 105 of the substrate support 104 during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing region 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing region 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source. In some embodiments, the chamber 100 may be configured with one or more gas inlets 158 to provide gas from beneath the substrate support 104. The gas inlets 158 may be incorporated into the wall of the chamber 100, but may also be integrated into the shaft 144, for example, to introduce a gas in the vicinity of the underside of the substrate support 104.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing region 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing region 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing region 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing region 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing region 120. The substrate may be subjected to an electrical bias using the third electrode 124 in some embodiments.

Upon energizing a plasma in the processing region 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chambers and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
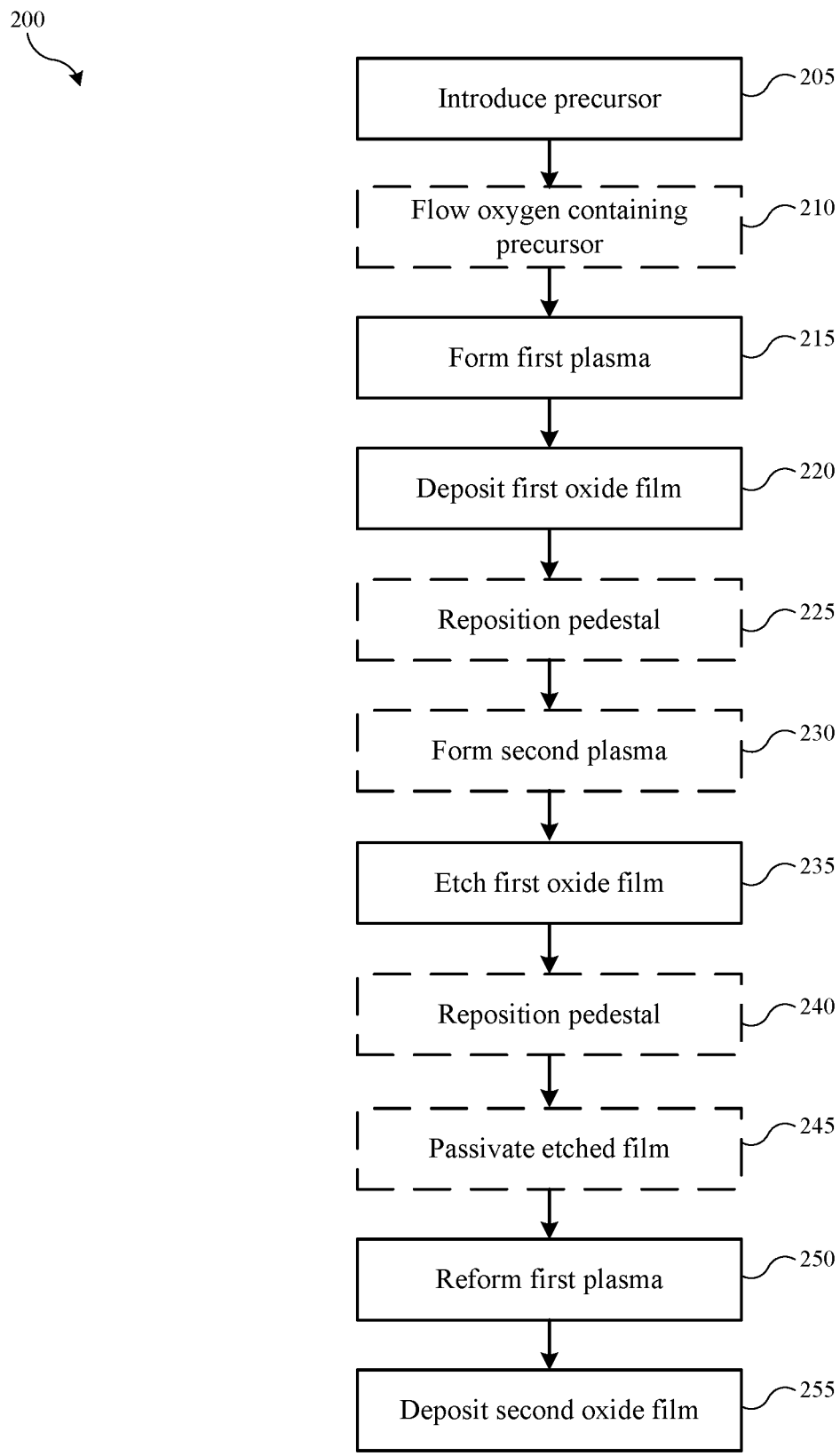
FIG. 2 shows exemplary operations in a deposition method according to some embodiments of the present technology.

FIG. 2 shows exemplary operations in a deposition method 200 according to some embodiments of the present technology. The method may be performed in a variety of processing chambers, including processing chamber 100 described above. Additional aspects of processing chamber 100 will be described further below. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

Method 200 may include additional operations prior to initiation of the listed operations. For example, additional processing operations may include forming structures on a semiconductor substrate, which may include both forming and removing material. Prior processing operations may be performed in the chamber in which method 200 may be performed, or processing may be performed in one or more other processing chambers prior to delivering the substrate into the semiconductor processing chamber in which method 200 may be performed. Regardless, method 200 may optionally include delivering a semiconductor substrate to a processing region of a semiconductor processing chamber, such as processing chamber 100 described above, or other chambers that may include components as described above. The substrate may be deposited on a substrate support, which may be a pedestal such as substrate support 104, and which may reside in a processing region of the chamber, such as processing region 120 described above. Method 200 describes operations shown schematically in FIG. 3, the illustrations of which will be described in conjunction with the operations of method 200. It is to be understood that FIG. 3 illustrates only partial schematic views, and a processing system may include subsystems as illustrated in the figures, as well as alternative subsystems, of any size or configuration that may still benefit from aspects of the present technology.

FIGS. 3A-3D show schematic views of an exemplary processing chamber during operations in a deposition method according to some embodiments of the present technology. FIGS. 3A-3D may illustrate further details relating to components in chamber 100, such as substrate support 104, gas distributor 112, and gas inlets 158. System 300 is understood to include any feature or aspect of chamber 100 discussed previously in some embodiments. The system 300 may be used to perform semiconductor processing operations including deposition, removal, and cleaning operations. System 300 may show a partial view of the chamber components being discussed and that may be incorporated in a semiconductor processing system, and may illustrate a view across a center of the pedestal and gas distributor, which may otherwise be of any size. Any aspect of system 300 may also be incorporated with other processing chambers or systems as will be readily understood by the skilled artisan.

System 300 may include a semiconductor processing chamber 350 including a showerhead 305, through which precursors may be delivered for processing, and which may be configured to form a plasma 310 in the processing region.

The showerhead 305 is shown at least partially internal to the chamber 350, and may be understood to be electrically isolated from the chamber 350, as described in reference to FIG. 1. In this way, the showerhead 305 may act as a live electrode or as a reference ground electrode of a direct plasma system to expose a substrate held on a pedestal or substrate support 315 to plasma generated species. The pedestal 315 may extend through the base of the chamber 350. The substrate support may include a support platen 320, which may hold a semiconductor substrate 330 during deposition or removal processes, as described in more detail in reference to FIG. 1 and FIG. 2. In addition to embedded electrodes described in connection with the chamber 100, the support platen 320 may also include a thermal control system that may facilitate processing operations including, but not limited to, deposition, etching, annealing, or desorption.

The system 300 may further incorporate additional gas inlet structures beneath the support platen 320. For example, the pedestal 315, the support platen 320, or the chamber 350 may include one or more gas inlets configured to introduce gas into the system 300. The one or more inlets may be configured to provide a relatively high concentration of a gas on the underside of the support platen 320, which may serve to protect the material of the pedestal from preferential etching of exposed chamber surfaces. In this way, the chamber 350 may implement pre-treatment and deposition processes to form oxide films onto wafers held on the support platen 320, for example, through introduction of various precursor gases and control of plasma process conditions.

Figure 3A:
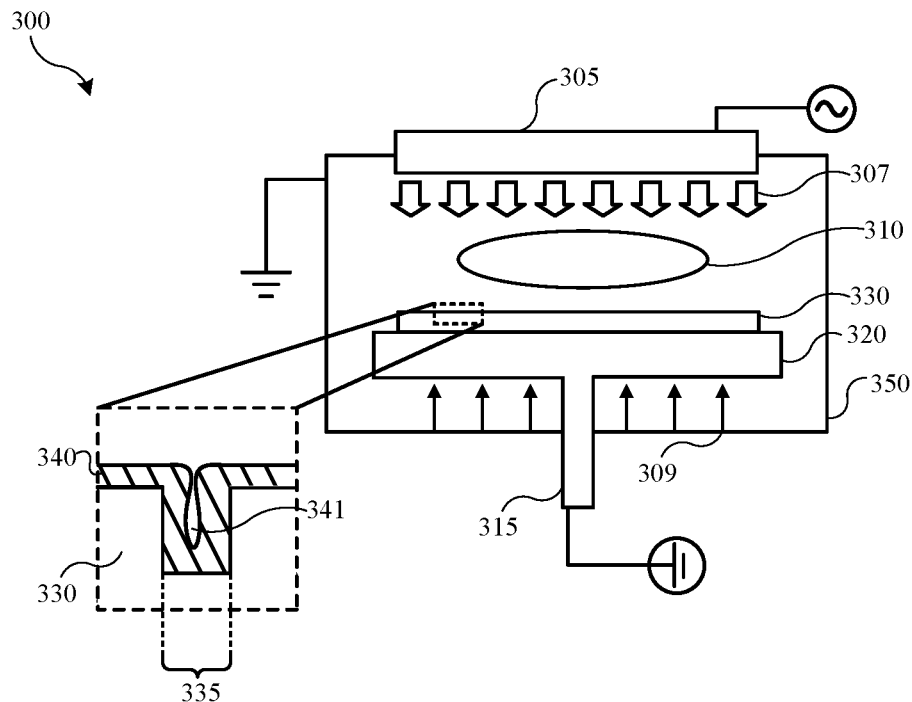
FIGS. 3A-3D show schematic views of an exemplary processing chamber during operations in a deposition method according to some embodiments of the present technology.

At operation 205, as illustrated in FIG. 3A, deposition procedures may include introducing a precursor 307 into the processing region of the system 300. Introducing the precursor 307 may include flowing a carrier gas through the showerhead 305, which may include multiple channels, such as the apertures 118 of FIG. 1, sized and positioned such that the precursor 307 is introduced with a controlled distribution into the processing region. The precursor 307 may be or include a silicon precursor including, but not limited to silane, tetra-ethyl orthosilicate (TEOS), or other silicon-containing precursor gas that is compatible with deposition of silicon oxide or silicon sub-oxide films in semiconductor fabrication. The precursor 307 may also include an inert carrier gas, including but not limited to, argon, helium, or nitrogen, and may also include an oxygen-containing gas, such as diatomic oxygen or water vapor. The precursor 307 may be introduced into the system 300 via the showerhead 305 according to a uniform flow pattern across the surface of the support platen 320. In some embodiments, the precursor 307 may be introduced according to a non-uniform flow pattern, for example, using a curtain flow around a periphery of the support platen 320.

In some embodiments, the precursor 307 may be or include TEOS, provided to the processing region at a flowrate greater than or about 0.5 SLM, greater than or about 1 SLM, greater than or about 1.5 SLM, greater than or about 2 SLM, greater than or about 2.5 SLM, greater than or about 3 SLM, greater than or about 3.5 SLM, greater than or about 4 SLM, greater than or about 4.5 SLM, greater than or about 5 SLM, greater than or about 5.5 SLM, greater than or about 6 SLM, greater than or about 6.5 SLM, greater than or about 7 SLM, greater than or about 7.5 SLM, or greater.

In some embodiments, the precursor 307 may be or include oxygen, provided to the processing region at a flowrate greater than or about 0.5 SLM, greater than or about 1 SLM, greater than or about 1.5 SLM, greater than or about 2 SLM, greater than or about 2.5 SLM, greater than or about 3 SLM, greater than or about 3.5 SLM, greater than or about 4 SLM, or greater.

In some embodiments, the precursor 307 may be or include argon, provided to the processing region at a flowrate greater than or about 0.5 SLM, greater than or about 1 SLM, greater than or about 1.5 SLM, greater than or about 2 SLM, greater than or about 2.5 SLM, greater than or about 3 SLM, greater than or about 3.5 SLM, greater than or about 4 SLM, or greater.

In some embodiments, method 200 may optionally include flowing an oxygen-containing precursor 309 into the processing region from beneath the support platen 320 at operation 210. As illustrated in FIG. 3A, the oxygen-containing precursor 309 may be introduced by a distributor or other inlet(s) incorporated into the chamber 350 of the system 300. The oxygen-containing precursor 309 may be or include diatomic oxygen, provided to the system 300 beneath the support platen at a flowrate greater than or about 0.5 SLM, greater than or about 1 SLM, greater than or about 1.5 SLM, greater than or about 2 SLM, greater than or about 2.5 SLM, greater than or about 3 SLM, greater than or about 3.5 SLM, greater than or about 4 SLM, greater than or about 4.5 SLM, greater than or about 5 SLM, greater than or about 5.5 SLM, greater than or about 6 SLM, greater than or about 6.5 SLM, greater than or about 7 SLM, greater than or about 7.5 SLM, greater than or about 8 SLM, greater than or about 8.5 SLM, greater than or about 9 SLM, greater than or about 9.5 SLM, greater than or about 10 SLM, greater than or about 10.5 SLM, greater than or about 11 SLM, greater than or about 11.5 SLM, greater than or about 12 SLM, greater than or about 12.5 SLM, greater than or about 13 SLM, greater than or about 13.5 SLM, greater than or about 14 SLM, greater than or about 14.5 SLM, greater than or about 15 SLM, or greater.

The provision of the oxygen-containing precursor 309 into the chamber 350 beneath the support platen 320 may serve to protect the surfaces of the pedestal 315 or the support platen 320 from reaction with plasma generated species. For example, as described in reference to FIG. 3B, a relatively high concentration of oxygen beneath the support platen 320 may prevent depletion of plasma generated species caused by surface recombination or other interactions with the conductive surfaces of internal chamber structures.

Subsequent introducing the oxygen-containing precursor, method 200 may include forming the plasma 310 at operation 215. The plasma 310 may be struck between the support platen 320 and the showerhead 305. High frequency (HF) power may be provided to the showerhead 305 such that it acts as a live electrode in a capacitively coupled plasma electrode configuration, with the support platen acting as a reference electrode. Forming the plasma 310 as a capacitively coupled plasma may provide multiple advantages over inductively-coupled plasma systems employed for semiconductor fabrication methods. For example, capacitively coupled plasmas may provide improved uniformity with respect to plasma generated species distribution in the processing volume. Since deposition processes are employed on a wafer scale, improved uniformity across the semiconductor substrate 330 may provide improved device yield per wafer, as well as other wafer-scale quality parameters.

In another example, forming a high-frequency plasma by capacitive coupling may provide improved control of ion directionality in the processing region. As described in reference to FIG. 1, the support platen 320 may emanate an electric field, for example through an electrostatic chuck employed to hold the semiconductor substrate 330. The electrostatic chuck voltage may be used to precipitate positively charged ions into the surface of the semiconductor substrate 330. In this way, the plasma 310 may be used to sputter the semiconductor substrate 330 as an approach to improving deposition or etch processes.

In another example, forming a capacitively coupled plasma in the processing region may provide improved control over deposition and etch processes. Arising from a relatively reduced gas dissociation rate in the plasma 310, as compared to an inductively coupled plasma, a capacitively coupled plasma configuration may permit a wider operational window with respect to plasma operating parameters. Control of plasma species composition near the surface, afforded by control of plasma electrical properties, may permit control of sputter processes, reactive ion densities, or plasma temperature, each influencing deposition and etch operations.

In some embodiments, the plasma 310 may be formed as a capacitively coupled plasma with both high-frequency (HF) power and low frequency (LF) power provided to the showerhead 305. HF power may be provided above or about 100 W, above or about 200 W, above or about 300 W, above or about 400 W, above or about 500 W, above or about 600 W, above or about 700 W, above or about 800 W, above or about 900 W, above or about 1000 W, above or about 1100 W, above or about 1200 W, above or about 1300 W, above or about 1400 W, above or about 1500 W, or more.

LF power may be provided above or about 100 W, above or about 200 W, above or about 300 W, above or about 400 W, above or about 500 W, above or about 600 W, above or about 700 W, above or about 800 W, above or about 900 W, above or about 1000 W, above or about 1100 W, above or about 1200 W, or more.

An electrostatic chuck bias voltage may be applied to the support platen 320 above or about 50 V, above or about 100 V, above or about 150 V, above or about 200 V, above or about 250 V, above or about 300 V, above or about 350 V, above or about 400 V, or more.

Subsequent forming the plasma 310, method 200 may include depositing an oxide film 340 on the semiconductor substrate 330 at operation 220. The oxide film 340 may be or include decomposition products generated in the plasma 310, for example, by reaction of silicon and oxygen in the gas phase that is then deposited on the substrate 330. In some embodiments, the substrate 330 may define recessed structures, such as a trench 335. In this way, the oxide film 340 may deposit on lateral and vertical surfaces of the substrate 330 and the trench 335. Over time, the oxide film 340 may bridge across the trench 335, forming a void 341 within the oxide film. One aspect of an approach to reducing the formation the void 341 is to limit the deposition time, which describes the time during which the plasma 310 is depositing plasma generated species onto the surface of the substrate. In some embodiments, the deposition time is longer than or about 200 seconds, longer than or about 250 seconds, longer than or about 300 seconds, longer than or about 350 seconds, longer than or about 400 seconds, longer than or about 450 seconds, longer than or about 500 seconds, longer than or about 550 seconds, longer than or about 600 seconds, longer than or about 650 seconds, longer than or about 700 seconds, longer than or about 750 seconds, longer than or about 800 seconds, or longer.

Figure 3B:
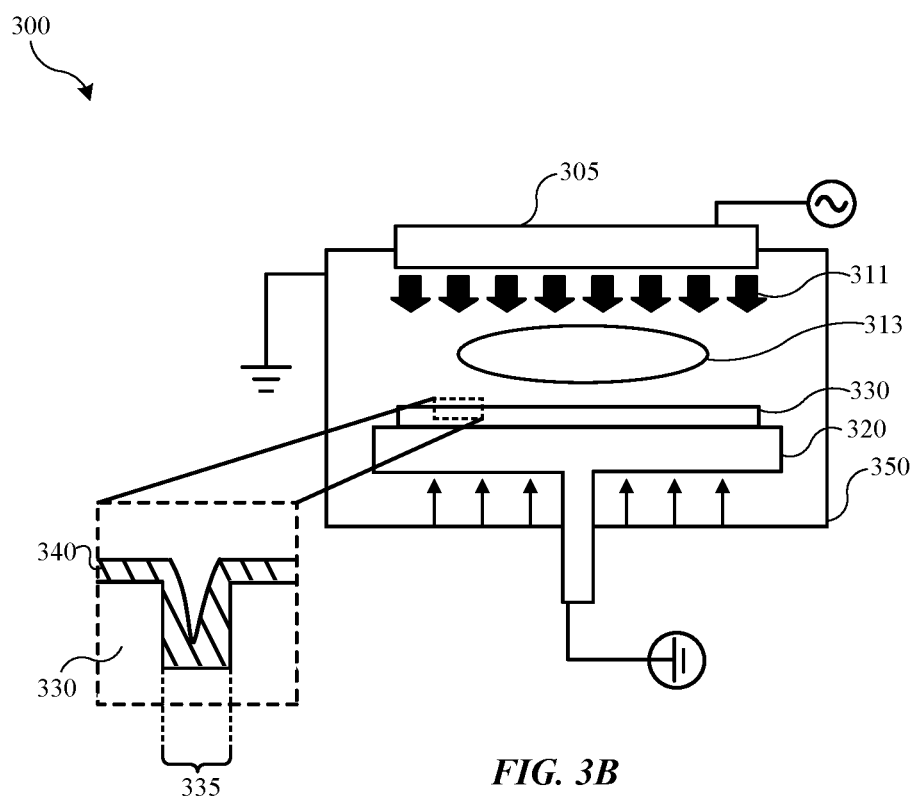
Figure 3C:
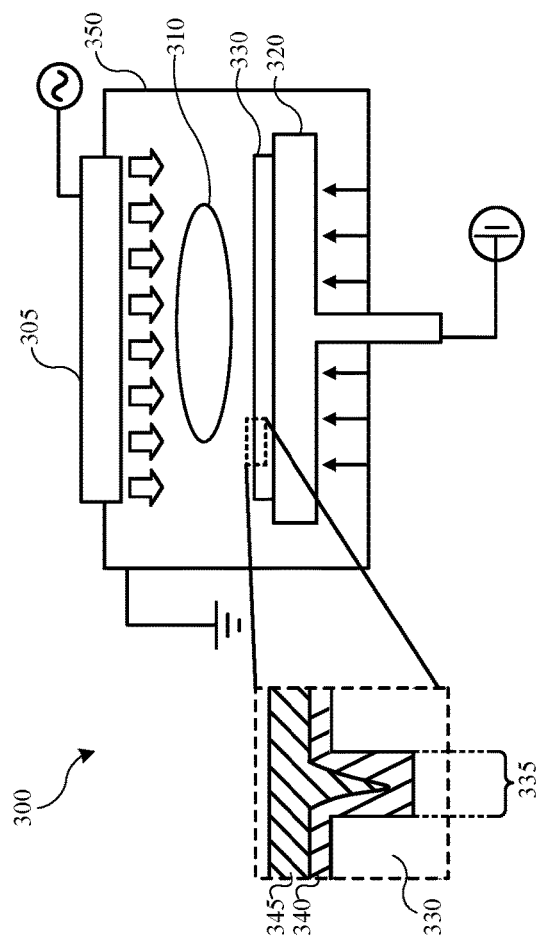
Figure 3D:
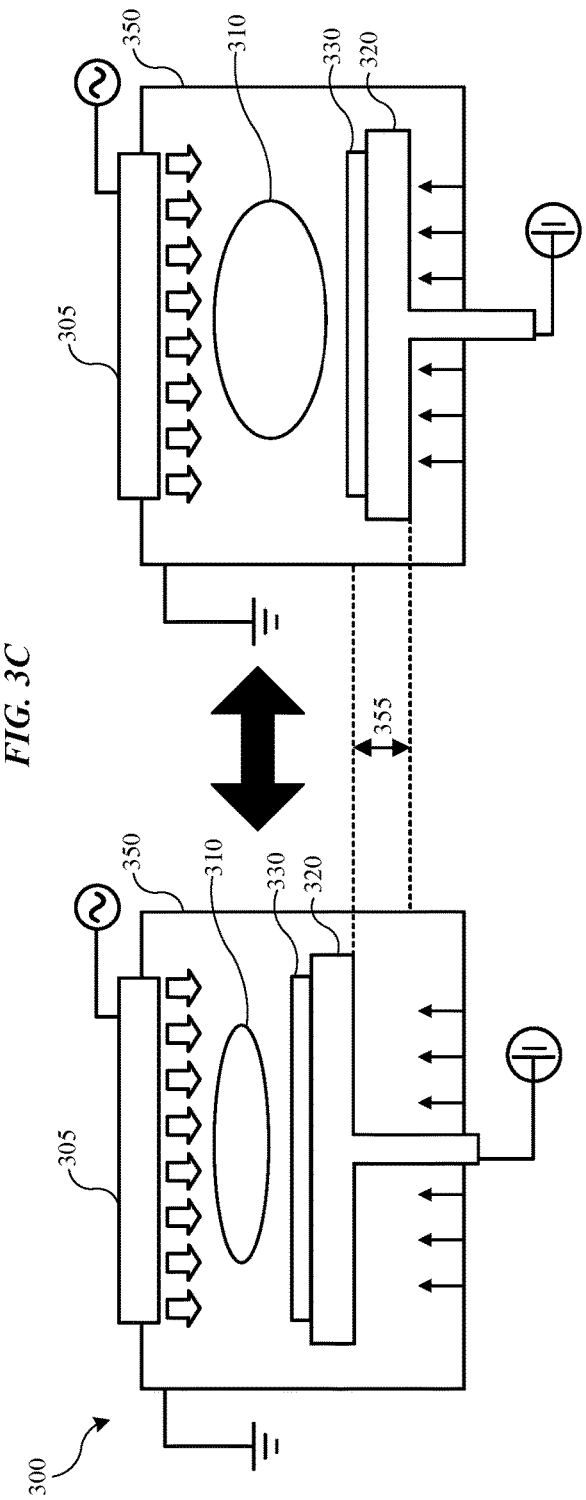

The presence of voids 341 in the oxide film 340 may limit the suitability of a single deposition process for use in gap-fill applications. As such, additional approaches may be employed to provide a seamless gap-fill with multiple deposition operations, as described in more detail in reference to FIGS. 3B-3D, below. For example, in some embodiments, method 200 may optionally include repositioning the pedestal 315 relative to the showerhead 305 at operation 225. As illustrated in FIG. 3D, the spacing between the showerhead 305 and the support platen 320 may affect the properties of the plasma 310. For example, in a capacitively coupled glow discharge plasma, repositioning the support platen 320 by a distance 355 may alter the plasma generated species densities at the surface of the substrate 330. Plasma species density and energy distributions may affect the rate of deposition, the chemical structure of the oxide film 340, the rate of etching, sputter rate, or other plasma-mediated chemical reactions occurring on the surface. In this way, adjusting the position of the support platen 320 may permit the plasma composition at the surface of the substrate 330 to be adjusted for improved deposition or etch processes.

In some embodiments, operation 225 may include repositioning the pedestal from a first spacing of at least or about 50 mils, at least or about 100 mils, at least or about 150 mils, at least or about 200 mils, at least or about 250 mils, at least or about 300 mils, at least or about 350 mils, at least or about 400 mils, at least or about 450 mils, at least or about 500 mils, at least or about 600 mils, or larger. In contrast, the second spacing may be less than or about 600 mils, less than or about 550 mils, less than or about 500 mils, less than or about 450 mils, less than or about 400 mils, less than or about 350 mils, less than or about 300 mils, less than or about 250 mils, less than or about 200 mils, less than or about 150 mils, less than or about 100 mils, less than or about 50 mils, or smaller. In some embodiments, operation 225 may include repositioning the pedestal by a distance 355 of at least or about 10 mils, at least or about 15 mils, at least or about 20 mils, at least or about 25 mils, at least or about 30 mils, at least or about 35 mils, at least or about 40 mils, at least or about 45 mils, at least or about 50 mils, at least or about 55 mils, at least or about 60 mils, at least or about 65 mils, at least or about 70 mils, at least or about 75 mils, at least or about 80 mils, at least or about 85 mils, at least or about 90 mils, at least or about 95 mils, at least or about 100 mils, at least or about 125 mils, at least or about 150 mils, at least or about 175 mils, at least or about 200 mils, at least or about 225 mils, at least or about 250 mils, at least or about 275 mils, at least or about 300 mils, or larger.

In some embodiments, method 200 may optionally include forming a second plasma 313 at operation 230. Forming the second plasma 313 may include multiple processes involved in transitioning the system 300 from a deposition plasma to an etch plasma. For example, operation 230 may include extinguishing the plasma formed at operation 215, purging the system 300 of precursor 307, introducing an etchant gas 311 into the processing volume, and striking the second plasma 313 between the showerhead 305 and the support platen 320. In some embodiments, the etchant gas 311 may be or include a halogen gas. In some embodiments, the etchant gas 311 may be or include nitrogen trifluoride. In this way, the second plasma 313 may generate reactive plasma species to selectively remove the oxide film 340 from the surface of the substrate 330.

In some embodiments, method 200 includes transitioning from a deposition plasma to an etch plasma without extinguishing the plasma formed at operation 215. For example, without extinguishing the plasma 310, a flowrate of the silicon precursor gas 307 may be stopped without stopping the flowrate of the inert carrier gas. In this way, the plasma 310 may be maintained while the concentration of plasma generated silicon species is reduced. Subsequent reduction of the silicon precursor flowrate, the etchant gas 311 may be introduced into the plasma 310.

Subsequent depositing the oxide film 340, method 200 may include etching the oxide film 340, at operation 235. Etching the oxide film 340, as illustrated in FIG. 3B, may include exposing the substrate 330 to the reactive plasma generated species formed by decomposition of the etchant gas 311, such that at least a portion of the oxide film 340 is removed from the surface of the substrate 330 and from within the trench 335. As shown, etching the oxide film 340 may permit the void 341 to be opened, and may permit the oxide film 340 to be prepared for filling in subsequent operations of method 200. As with the deposition of operation 220, etching may proceed according to an average reaction rate that depends at least in part on density of reactive species at the surface, as well as an ion flux into the surface of the substrate 330. As described above, the support platen 320 may provide an electric field to precipitate ions from the etch plasma into the surface of the substrate 330. Ion bombardment may facilitate reactive sputtering of the oxide film 340, and may further improve the efficacy of the etch at operation 235.

As described in reference to operation 210, method 200 may include introducing oxygen or an oxygen-containing gas into the chamber 350 before and during the etch at operation 235. Introduction of oxygen from beneath the support platen 320 may prevent reactive halogen species generated in the plasma 310 or the second plasma 313 from reacting preferentially with the conductive surfaces of the support platen 320 and the pedestal 315. In some cases, ions generated in the plasma 310 or the second plasma 313 may be preferentially directed along electric field lines toward conductive surfaces, rather than the substrate 330. Introduction of a relatively high density of oxygen may inhibit the attraction of the halogen ions away from the substrate 330, which may, in turn, increase the efficacy of the etch process.

In some embodiments, following the etch process at operation 235, method 200 may optionally include one or more optional operations including, but not limited to, returning the pedestal 315 to a deposition position at operation 240, passivating the oxide film 340 at operation 245. In some embodiments, passivating the surface of the substrate 330 and the oxide film 340 may include stopping the flow of the etchant gas 311 as part of exchanging the gas in the chamber 300 and provide a passivating environment. Passivation of the oxide film may include striking an oxygen rich plasma to oxidize residual halogen species remaining on the surface of the substrate 330.

Subsequent etching, method 200 may include reforming the plasma 310 at operation 250. Reforming the plasma 310 may include reintroducing the precursor gas 307 through the showerhead 305, maintaining or reintroducing the oxygen-containing precursor 309 from beneath the support platen 320, and striking a capacitively coupled plasma between the support platen 320 and the showerhead 305. Reforming the plasma 310 may facilitate additional deposition for gap-fill of the trench 335. In some embodiments, the plasma 310 may be maintained and, as such, reforming the plasma 310 may include gas exchange from the etchant gas 311 or the passivation gas to the precursor gas 307 without extinguishing the plasma 310, for example, by maintaining an inert gas flow in the chamber 350.

Subsequent reforming the first plasma 310, method 200 may include depositing a second oxide film 345 within the trench 335, at operation 255. As illustrated in FIG. 3C, depositing the second oxide film 345 may include forming a silicon oxide or silicon sub-oxide film that is deposited uniformly on the surface of the substrate 330 and within the trench 335. In contrast to the condition of the oxide film 340 prior to etching at operation 235, the oxide film 340 subsequent etching may exhibit sloping side walls such that the second oxide film 345 may deposit as a conformal layer onto the oxide film 340. In this way, the oxide film 340 and the second oxide film 345 may seamlessly fill the trench 335. The combined oxide film 340 and second oxide film 345 may permit subsequent processing operations, such as planarization, to produce a fill material suitable for semiconductor fabrication. The process parameters of operation 240 may mirror those of operation 220, as described in reference to FIG. 3A, above. For example, each deposition process may be configured to deposit an oxide film with a thickness of at least or about 0.5 µm, at least or about 1 µm, at least or about 1.5 µm, at least or about 2 µm, at least or about 2.5 µm, at least or about 3 µm, at least or about 3.5 µm, at least or about 4 µm, at least or about 4.5 µm, at least or about 5 µm, at least or about 5.5 µm, at least or about 6 µm, or more. In some cases, however, the first deposition process of operation 220 may differ from the second deposition process of operation 255.

By utilizing methods and components according to embodiments of the present technology, material deposition or formation may be improved. By reducing the formation of void inclusions in deposited oxide films, improved semiconductor fabrication processes may incorporate oxide structures at increasingly small feature sizes. These improvements may include improved etch processes, facilitated by reduced radical scavenging by conductive chamber surfaces, improved deposition and etch processes facilitated by forming a capacitively coupled plasma formed in the processing region of a semiconductor processing chamber, and improved semiconductor yield on a wafer scale resulting at least in part from improved process uniformity. As described above, capacitively coupled plasmas may provide better plasma uniformity relative to inductively coupled plasmas, and may provide improved etch uniformity. Capacitively coupled plasmas, which may be generated in the processing region directly, may provide directionality of ions for sputtering, and may improve deposition of oxide films by inhibiting formation of an oxide film bridge or overhand resulting in formation of a void volume. Additionally, gas dissociation may be reduced in capacitively coupled plasmas relative to inductively coupled plasmas, due at least in part to lower average electron energy. Reduced gas dissociation may, in turn, provide improved process control for deposition and etch.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed. For example, the introduction of oxygen or another oxygen-containing gas at operation 210 may be implemented alternatively, including, but not limited to, at any time prior to operation 235.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A deposition method comprising:
introducing a precursor into a processing region of a semiconductor processing chamber via a faceplate of the semiconductor processing chamber;
flowing an oxygen-containing precursor into the semiconductor processing chamber from beneath a pedestal of the semiconductor processing chamber, wherein the pedestal supports a substrate, and wherein the substrate defines a trench in a surface of the substrate;
forming a first plasma of the precursor in the processing region of the semiconductor processing chamber;
depositing a first oxide film within the trench;
forming a second plasma in the processing region;
etching the first oxide film, while flowing the oxygen-containing precursor;
passivating the etched first oxide film;
re-forming the first plasma in the processing region; and
depositing a second oxide film over the etched first oxide film.

2. The deposition method of claim 1, wherein flowing the oxygen- containing precursor into the processing region comprises flowing oxygen into the semiconductor processing chamber at a flowrate of at least 5 slm.

3. The deposition method of claim 1, wherein the first plasma is a capacitively coupled plasma, and wherein the first plasma is struck between the pedestal and the faceplate of the semiconductor processing chamber.

4. The deposition method of claim 1, wherein the second plasma is a capacitively coupled plasma, and wherein the second plasma is struck between the pedestal and the faceplate.

5. The deposition method of claim 1, wherein etching the deposited first oxide film comprises:
   purging the semiconductor processing chamber;
   introducing an etchant gas into the processing region; and
   forming the second plasma of the etchant gas in the processing region.

6. The deposition method of claim 5, wherein purging the semiconductor processing chamber comprises:
   extinguishing the first plasma; and
   exchanging the precursor and the oxygen-containing precursor for the etchant gas in the processing region.

7. The deposition method of claim 5, wherein the etchant gas comprises a fluorine-containing gas.

8. The deposition method of claim 1, wherein the precursor comprises silane.

* * * * *